(12) United States Patent
Sundgren

(10) Patent No.: US 11,569,635 B2
(45) Date of Patent: Jan. 31, 2023

(54) RADIATION-EMITTING SEMICONDUCTOR COMPONENT

(71) Applicant: OSRAM OLED GmbH, Regensburg (DE)

(72) Inventor: Petrus Sundgren, Lappersdorf (DE)

(73) Assignee: OSRAM OLED GMBH, Regensburg (DE)

( * ) Notice: Subject to any disclaimer, the term of this patent is extended or adjusted under 35 U.S.C. 154(b) by 317 days.

(21) Appl. No.: 16/767,067

(22) PCT Filed: Nov. 12, 2018

(86) PCT No.: PCT/EP2018/080935
§ 371 (c)(1),
(2) Date: May 26, 2020

(87) PCT Pub. No.: WO2019/110248
PCT Pub. Date: Jun. 13, 2019

(65) Prior Publication Data
US 2020/0295539 A1 Sep. 17, 2020

(30) Foreign Application Priority Data
Dec. 5, 2017 (DE) .......................... 102017128881.3

(51) Int. Cl.
*H01S 5/30* (2006.01)
*H01S 5/042* (2006.01)
(Continued)

(52) U.S. Cl.
CPC .......... *H01S 5/3095* (2013.01); *H01L 27/153* (2013.01); *H01L 33/06* (2013.01);
(Continued)

(58) Field of Classification Search
CPC ................................ H01L 33/465; H01S 5/42
See application file for complete search history.

(56) References Cited

U.S. PATENT DOCUMENTS 4,979,002 A * 12/1990 Pankove ............... H01S 5/4031
257/E33.044
6,064,683 A 5/2000 Johnson
(Continued)

FOREIGN PATENT DOCUMENTS

DE 69828712 T2 4/2006
EP 0709939 * 5/1996 ............. H01S 3/085
EP 0709939 A1 5/1996

OTHER PUBLICATIONS

C. Asplund, et al., "Doping-Induced Losses in AlAs/GaAs Distributed Bragg Reflectors," Journal of Applied Physics, vol. 90, No. 2, Jul. 15, 2001, pp. 794-800.

*Primary Examiner* — Tuan N Nguyen
(74) *Attorney, Agent, or Firm* — Slater Matsil, LLP

(57) ABSTRACT

A radiation-emitting semiconductor component is disclosed. In an embodiment, a component includes a semiconductor layer sequence and a carrier on which the semiconductor layer sequence is arranged, wherein the semiconductor layer sequence comprises an active region configured for generating radiation, an n-conducting mirror region and a p-conducting mirror region, wherein the active region is arranged between the n-conducting mirror region and the p-conducting mirror region, and wherein the p-conducting mirror region is arranged closer to the carrier than the active region.

18 Claims, 3 Drawing Sheets

(51) Int. Cl.
*H01L 27/15* (2006.01)
*H01L 33/06* (2010.01)
*H01L 33/46* (2010.01)
*H01S 5/02* (2006.01)
*H01S 5/183* (2006.01)
*H01S 5/343* (2006.01)
*H01S 5/42* (2006.01)

(52) U.S. Cl.
CPC .......... *H01L 33/465* (2013.01); *H01S 5/0206* (2013.01); *H01S 5/04256* (2019.08); *H01S 5/18308* (2013.01); *H01S 5/18313* (2013.01); *H01S 5/18361* (2013.01); *H01S 5/343* (2013.01); *H01S 5/423* (2013.01)

(56) References Cited

U.S. PATENT DOCUMENTS

| | | | |
|---|---|---|---|
| 6,570,905 B1 | 5/2003 | Ebeling | |
| 7,110,427 B2 | 9/2006 | Johnson et al. | |
| 2003/0006416 A1* | 1/2003 | Dudoff | H01L 25/167 257/E25.032 |
| 2003/0185267 A1* | 10/2003 | Hwang | H01S 5/18358 372/96 |
| 2004/0135136 A1* | 7/2004 | Takahashi | H01S 5/22 257/14 |
| 2005/0078726 A1* | 4/2005 | Watanabe | H01S 5/18311 372/46.01 |
| 2007/0223546 A1 | 9/2007 | Brenner et al. | |

* cited by examiner

//  RADIATION-EMITTING SEMICONDUCTOR COMPONENT

This patent application is a national phase filing under section 371 of PCT/EP2018/080935, filed Nov. 12, 2018, which claims the priority of German patent application 102017128881.3, filed Dec. 5, 2017, each of which is incorporated herein by reference in its entirety.

TECHNICAL FIELD

The present application relates to a radiation-emitting semiconductor component.

BACKGROUND

In semiconductor components in which the epitaxially deposited material fulfils the function of a mirror in places, the doping can have a negative effect on the reflectivity of the mirror to be produced. For example, it has been shown that silicon deteriorates the interface quality of a distributed Bragg reflector (DBR) and thus the reflectivity. On the other hand, compared to other dopants, silicon is characterized, for example, by low absorption by free charge carriers and low segregation during the epitaxial process.

In principle, dopants within such Bragg mirrors can be avoided if the electrical contact is not made through these mirrors. However, this requires contacts within the resonator. These require additional space and require an etching step that on the one hand etches through the comparatively thick Bragg mirror and on the other hand reliably stops at a comparatively thin highly doped layer. Especially in a matrix with such semiconductor components, the maximum density of segments is reduced due to the space required for contacts within the resonator, wherein the segments can be individually controlled, but do not have to be.

SUMMARY

Embodiments provide a radiation-emitting semiconductor component in which a mirror region is characterized by a high reflectivity and in which a high density, especially of individually controllable regions, can still be achieved.

In an embodiment, a radiation-emitting semiconductor component is specified which has a semiconductor layer sequence. The semiconductor layer sequence is particularly formed by epitaxially deposited semiconductor layers. For example, the semiconductor layers of the semiconductor layer sequence are produced by a MOCVD process or an MBE process. In particular, the semiconductor layers of the semiconductor layer sequence are the only epitaxially deposited semiconductor layers of the semiconductor component.

According to at least one embodiment of the radiation-emitting semiconductor component, the semiconductor component has a carrier on which the semiconductor layer sequence is arranged. For example, the carrier is a growth substrate for the epitaxial deposition of the semiconductor layer sequence. Thus, the semiconductor layer sequence is epitaxially deposited on the carrier. In this case there is no material bond between the semiconductor layer sequence and the carrier. In a material bond, prefabricated bonding partners are held together by atomic and/or molecular forces. A material bond may be formed, for example, by means of a connection means, such as an adhesive or solder, or by direct bonding.

According to at least one embodiment of the radiation-emitting semiconductor component, the semiconductor layer sequence comprises an active region configured for generating radiation. For example, the active region is configured to generate radiation in the visible or infrared spectral range.

According to at least one embodiment of the radiation-emitting semiconductor component, the semiconductor component comprises an n-conducting mirror region and a p-conducting mirror region. The n-conducting mirror region and the p-conducting mirror region are each part of the semiconductor layer sequence. The active region is arranged in particular between the n-conducting mirror region and the p-conducting mirror region. In particular, the p-conducting mirror region and the n-conducting mirror region form a resonator for the electromagnetic radiation to be generated in the active region during operation of the semiconductor component. The mirror regions are different from each other in terms of their conductivity type, so that charge carriers can be injected into the active region from opposite sides via the mirror regions and recombine there, emitting radiation.

According to at least one embodiment of the radiation-emitting semiconductor component, the p-conducting mirror region is located closer to the carrier than the active region. In epitaxial deposition on the carrier, the p-conducting mirror region can thus be formed before the active region is formed. Furthermore, the n-conducting mirror region can be formed after the active region has already been formed. The n-conducting mirror region therefore has no or at least a greatly reduced influence on the material quality of the active region during the manufacture of the radiation-emitting semiconductor component.

The radiation-emitting semiconductor component may also have more than one active region. In this case, the p-conducting mirror region is located in particular between the carrier and the active region of the radiation-emitting semiconductor component closest to the carrier.

In at least one embodiment of the radiation-emitting semiconductor component, the radiation-emitting semiconductor component has a semiconductor layer sequence and a carrier on which the semiconductor layer sequence is arranged. The semiconductor layer sequence comprises an active region configured for generating radiation, an n-conducting mirror region and a p-conducting mirror region, the active region being arranged between the n-conducting mirror region and the p-conducting mirror region. The p-conducting mirror region is arranged closer to the carrier than the active region.

According to at least one embodiment of the radiation-emitting semiconductor component, the carrier is doped n-conductively. For example, the carrier is doped with silicon. For example, the carrier comprises gallium arsenide doped with silicon.

In particular, the carrier is n-conducting, although the p-conducting mirror region is located between the carrier and the active region—or, where appropriate, the active region closest to the carrier in the case of several active regions. N-doped carriers, especially silicon-doped gallium arsenide carriers, have a lower defect density than undoped or p-doped carriers. A high crystal quality of the active region can thus be easily achieved.

According to at least one exemplary embodiment of the radiation-emitting semiconductor component, a tunnel junction is formed between the p-conducting mirror region and the carrier. The tunnel junction is configured in particular to facilitate charge carrier injection from the carrier into the p-conducting mirror region. For example, the tunnel junction comprises two tunnel layers, which differ from each other in terms of their conductivity type and which are each heavily doped. For example, the doping concentration in the tunnel layers is at least $1 \times 10^{19}$ cm$^{-3}$ or at least $1 \times 10^{20}$ cm$^{-3}$ in each case.

In particular, the tunnel layers are more heavily doped, e.g., at least five times as heavily or at least ten times as heavily doped as the material of the carrier and/or the p-conducting mirror region adjacent to the tunnel layers.

According to at least one embodiment of the radiation-emitting semiconductor component, there is a direct electrical connection between the tunnel junction and the carrier. In particular, a direct electrical connection is considered to be one in which there is no other functional region between the elements to be electrically connected. In particular, there is no active region configured for generating radiation between the tunnel junction and the carrier.

According to at least one embodiment of the radiation-emitting semiconductor component, a main dopant of the n-conducting mirror region is different from silicon. The main dopant is considered to be the dopant with the highest concentration. However, the term main dopant does not necessarily imply that more than one dopant is present in the n-conducting mirror region. In fact, only one dopant can be present in the n-conducting mirror region. By dispensing with silicon or at least by reducing the use of silicon, the crystal quality and thus the reflectivity of the mirror region can be increased.

According to at least one embodiment of the radiation-emitting semiconductor component,
the n-conducting mirror region contains at least one of the following materials as a dopant: Te, Sn, Se. In particular, one of the mentioned materials is the main dopant. Compared to silicon as a dopant, these dopants can achieve an improved reflectivity for the n-conducting mirror region.

According to at least one embodiment of the radiation-emitting semiconductor component, the semiconductor layer sequence is based on the material system $In_yAl_xGa_{(1-x-y)}P_zAs_{(1-z)}$ with $0 \leq x \leq 1$, $0 \leq y \leq 1$, $x+y \leq 1$ and $0 \leq z \leq 1$. This material does not necessarily have to have a mathematically exact composition according to the above formula. Rather, it may, for example, contain one or more dopants and additional constituents. For simplicity's sake, however, the above formula includes only the essential constituents of the crystal lattice (Al, Ga, In, As, P), even though these may be partially replaced and/or supplemented by small amounts of other substances.

With this material system, radiation in the visible, in particular in the yellow and red, spectral range and in the infrared spectral range can be achieved with high efficiency.

According to at least one embodiment of the radiation-emitting semiconductor component, the semiconductor component comprises a rear contact which is electrically conductively connected to the p-conducting mirror region via the carrier. The rear contact is used for electrical contacting of the active region from the side facing the carrier. For example, the rear contact is arranged on a rear side of the carrier facing away from the semiconductor layer sequence.

According to at least one embodiment of the radiation-emitting semiconductor component, the semiconductor component has a front contact which is arranged on the side of the n-conducting mirror region facing away from the active region. The front contact is used for electrical contacting of the active region from the side facing away from the carrier.

According to at least one embodiment of the radiation-emitting semiconductor component, the active region of the semiconductor component is divided into a plurality of segments. During operation, the segments can in particular be controlled independently of each other. For example, the rear contact forms a common rear contact for at least two or all segments. The segments are arranged side by side in the lateral direction, i.e., along a main plane of extension of the active region, for example, in a row or in a two-dimensional matrix. By means of electrical contacting through the mirror regions, high densities can be achieved for the segments in the lateral direction in a simplified manner, especially compared to arrangements in which a buried contact layer in the resonator must be contacted through a Bragg mirror. The segments can also be at least partially electrically interconnected, for example, electrically in parallel and/or electrically in series. In this case the segments or at least part of the segments cannot be electrically contacted independently of each other.

According to at least one embodiment of the radiation-emitting semiconductor component, the semiconductor component comprises a current constriction structure. By means of the current constriction structure, the area where charge carriers recombine radiatively in the active region can be limited in the lateral direction.

According to at least one embodiment of the radiation-emitting semiconductor component, the current constriction structure comprises an oxide aperture. Oxide apertures can be formed after epitaxial deposition of the semiconductor layer sequence and in particular after lateral structuring of the semiconductor layer sequence by oxidation of the semiconductor material in certain areas.

According to at least one embodiment of the radiation-emitting semiconductor component, the current constriction structure comprises an implantation region.

An implantation region can be formed after epitaxial deposition of the semiconductor layer sequence. By implanting ions, the electrical conductivity can be reduced locally in a targeted manner. A previous lateral structuring of the semiconductor layer sequence is not necessary for the formation of a current constriction structure by means of an implantation region in contrast to an oxide aperture.

According to at least one embodiment of the radiation-emitting semiconductor component, the radiation-emitting semiconductor component is designed as a VCSEL. The term "VCSEL" is the abbreviation for Vertical Cavity Surface Emitting Laser, i.e., a surface-emitting laser with a vertical cavity. The radiation-emitting semiconductor component is thus configured to emit coherent radiation during operation.

The cavity represents the resonator of the surface-emitting laser. In contrast to an edge-emitting laser, the radiation exit surface of such a laser is parallel to a main plane of extension of the active region. In this context, "vertical" means that a main axis of the cavity is perpendicular to the main plane of extension of the active region.

However, the radiation-emitting semiconductor component may also be configured to generate incoherent or partially coherent radiation. For example, the radiation-emitting semiconductor component is a Resonant Cavity Light Emitting Diode (RCLED).

BRIEF DESCRIPTION OF THE DRAWINGS

Further embodiments and functionalities will become apparent from the following description of the exemplary embodiments in connection with the figures, wherein.

Equal or similar elements as well as elements of equal function are designated with the same reference signs in the figures.

The figures are all schematic representations and therefore not necessarily true to scale. Rather, comparatively small elements and especially layer thicknesses may be shown in exaggerated size for clarification.

DETAILED DESCRIPTION OF ILLUSTRATIVE EMBODIMENTS

Figure 1:
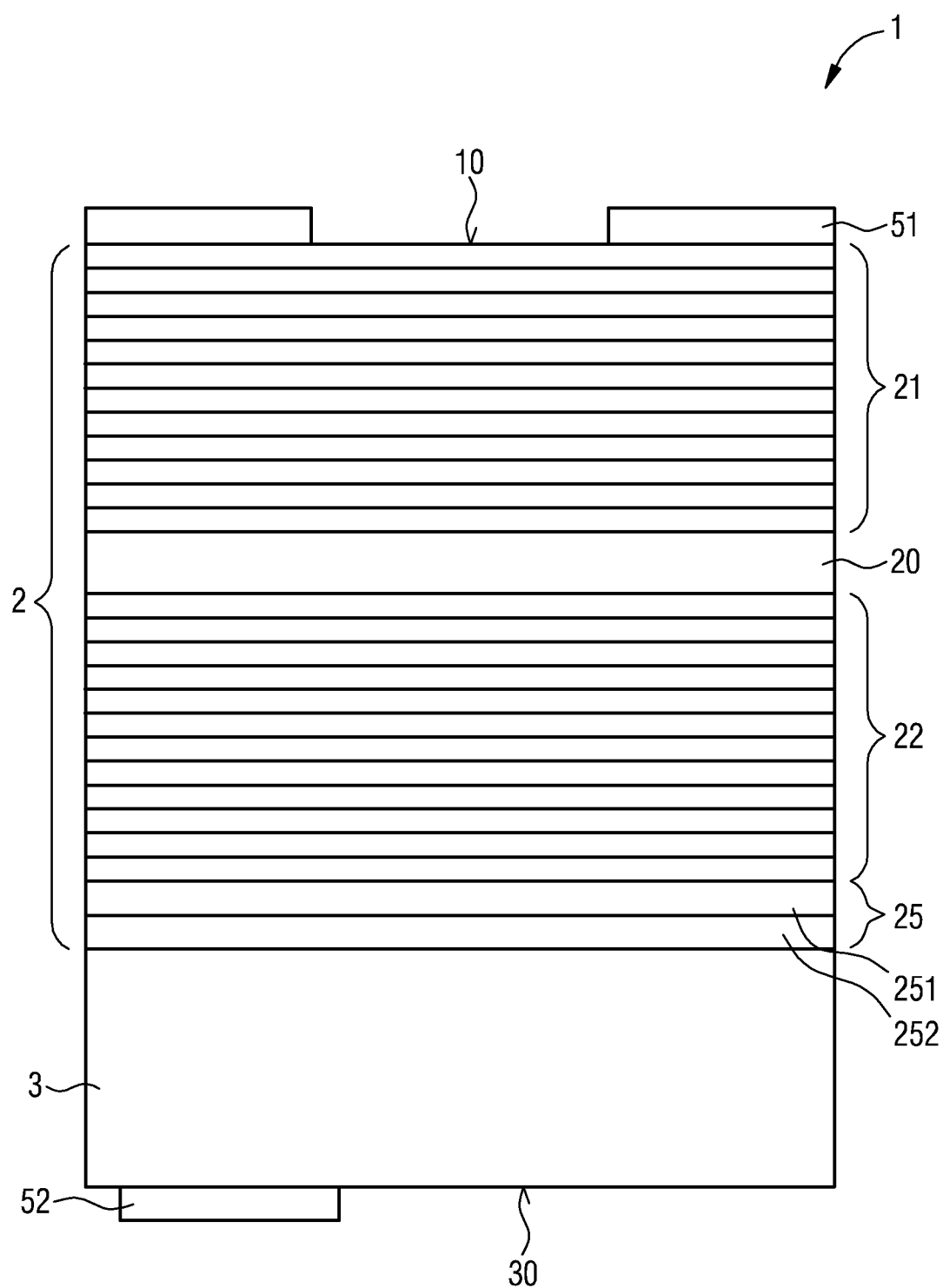
FIG. 1, FIG. 2 and FIG. 3 each show a schematic sectional view of an exemplary embodiment of a radiation-emitting semiconductor component.

An exemplary embodiment of a radiation-emitting semiconductor component is shown schematically in FIG. 1 in a sectional view. The semiconductor component 1 has a semiconductor layer sequence 2. The semiconductor layer sequence 2 is arranged on a carrier 3. In particular, the semiconductor layer sequence 2 is epitaxially deposited on the carrier 3, so that no material bond is required between the carrier 3 and the semiconductor layer sequence 2.

In the vertical direction, the semiconductor layer sequence 2 is limited by a radiation exit surface 10 and the carrier 3 opposite the radiation exit surface.

The semiconductor layer sequence 2 comprises an active region 20 configured for generating radiation. For example, the active region has a quantum structure.

In the context of the present application, the term quantum structure includes in particular any structure in which charge carriers can experience a quantization of their energy states by confinement. In particular, the term quantum structure does not contain any information about the dimensionality of quantization. It includes quantum wells, quantum wires, quantum rods and quantum dots and any combination of these structures. The quantum structure is not explicitly shown in FIG. 1 for the sake of simplicity.

The semiconductor layer sequence 2 also comprises an n-conducting mirror region 21 and a p-conducting mirror region 22. The active region 20 is arranged between the n-conducting mirror region and the p-conducting mirror region. Between the active region 20 and the n-conducting mirror region 21 and/or between the active region 20 and the p-conducting mirror region 22, one or more further layers may be arranged in deviation from the schematic representation.

The p-conducting mirror region 22 is arranged closer to the carrier 3 than the active region 20. In the epitaxial deposition of the semiconductor layer sequence, the deposition of the n-conducting mirror region 21 therefore takes place only after the deposition of the material for the active region 20. For the n-conducting mirror region 21, therefore, dopants can also be used which would complicate the epitaxial deposition of a subsequent active region.

For example, the n-conducting mirror region 21 may comprise tellurium as a dopant, especially as the main dopant. Compared to silicon, tellurium can achieve a higher reflectivity for the n-conducting mirror region 21. Tellurium shows a stronger segregation during epitaxial deposition than silicon. However, since the active region 20 is already present at the time of deposition of the n-conducting mirror region 21, there is no danger that segregation of tellurium will lead to an unwanted n-doping of the active region 20.

As an alternative or in addition to tellurium, the n-conducting mirror region may contain tin and/or selenium as a dopant. Preferably, the n-conducting mirror region is nominally free of silicon.

A tunnel junction 25 is formed between the p-conducting mirror region 22 and the carrier 3. The tunnel junction 25 is formed by means of a first tunnel layer 251 and a second tunnel layer 252, wherein these tunnel layers differ from each other with respect to their doping type and are each heavily doped, for example, with a doping concentration of at least $1*10^{20}$ cm$^{-3}$. The first tunnel layer 251 forms the side of the tunnel junction 25 facing the p-conducting mirror region 22. Correspondingly, the second tunnel layer 252 forms the side of the tunnel region facing the carrier 3. The first tunnel layer 251 and the second tunnel layer 252 each have the same conductivity type as the material adjacent to them. The first tunnel layer 251 is thus doped n-conductively and the second tunnel layer 252 is doped p-conductively.

Furthermore, opposite main surfaces of the semiconductor layer sequence 2, which limit the semiconductor layer sequence in the vertical direction, are each doped n-conductively. Thus, n-conducting semiconductor material adjoins the carrier 3, although the mirror region closest to the carrier is p-conducting.

The carrier 3 is doped n-conductively. For example, the carrier is an n-conducting GaAs carrier. Compared to undoped or p-doped GaAs, n-doped GaAs is characterized by a particularly high crystal quality. There is a direct electrical connection between the tunnel junction 25 and the carrier 3. There is no active region between the tunnel junction and the carrier. The tunnel junction is therefore not used for the electrical connection between two active regions, but for the electrical connection of the p-conducting mirror region 22 to the n-conducting carrier 3.

The carrier 3 and the n-conducting mirror region 21 have the same conductivity type, although the n-conducting mirror region 21 is arranged on the side of active region 20 facing away from the carrier 3. The material quality of the active region can thus be increased, on the one hand, by the fact that the carrier is n-conducting and, on the other hand, by the fact that the n-conducting mirror region 21 is arranged on the side of the active region 20 facing away from the carrier 3, so that a material can also be used for the n-conducting mirror region which would make the subsequent deposition of a high-quality active region 20 more difficult.

The doping of the n-conducting mirror region 21 can thus be optimized with regard to a high reflectivity of the n-conducting mirror region, for example by using tellurium, tin and/or selenium as a dopant.

The n-conducting mirror region 21 and the p-conducting mirror region 22 are each formed by a layer sequence in which layers with different refractive indices are deposited on top of each other, thus forming a Bragg mirror. For example, the refractive index can be efficiently adjusted via the aluminum content of the layers.

The mirror regions which form the resonator for the radiation-emitting semiconductor component are each electrically conductive, so that the radiation-emitting semiconductor component 1 can be electrically contacted through the mirror regions.

The radiation-emitting semiconductor component 1 comprises a front contact 51 on the side of the n-conducting mirror region 21 facing away from the active region 20. For example, the front contact 51 is of annular design so that the radiation generated in the active region 20 during operation can be coupled out unhindered along an axis through the center of gravity of the radiation-emitting semiconductor component from the radiation exit surface 10 opposite the carrier 3. For example, the front contact 51 has a circular opening for coupling out radiation.

The p-conducting mirror region 22 is electrically contacted via a rear contact 52. The rear contact 52 is arranged on a rear side 30 of the carrier facing away from the semiconductor layer sequence 2.

The p-conducting mirror region 22 is electrically contacted via the material of the carrier 3, in particular in the vertical direction through the carrier 3.

For the electrical contacting of the active region 20, neither the n-conducting mirror region 21 nor the p-conducting mirror region 22 must be removed in places to contact a buried electrically conductive layer. This simplifies production.

Carbon and/or magnesium and/or zinc are suitable as dopants for the p-conducting mirror region 22.

For example, the semiconductor layer sequence is based on the material system $In_yAl_xGa_{(1-x-y)}P_zAs_{(1-z)}$ with $0 \leq x \leq 1$, $0 \leq y \leq 1$, $x+y \leq 1$ and $0 \leq z \leq 1$.

The tunnel junction 25 contains AlGaAs or GaAs, for example.

The active region 20 contains, for example, InGaAs or InGaAlP for generating radiation in the infrared or visible spectral range.

The radiation-emitting semiconductor component 1 is designed as a VCSEL, for example. Alternatively, the radiation-emitting semiconductor component can also be an RCLED.

In comparison to a VCSEL with a silicon-doped mirror, higher efficiency, a lower laser threshold and higher operating temperatures can be achieved due to the improved reflectivity of the n-conducting mirror region 21.

Compared to components in which at least one mirror region is formed by means of electrically insulating dielectric layers, production is simpler and more cost-effective. This applies in particular to a radiation-emitting semiconductor component with a plurality of segments (see FIG. 3). These segments can, but do not have to be individually controllable.

Compared to a semiconductor component with a p-doped GaAs carrier, a higher crystal quality for the active region 20 can be achieved due to lower defect densities of the carrier during epitaxial deposition on the carrier.

Figure 2:
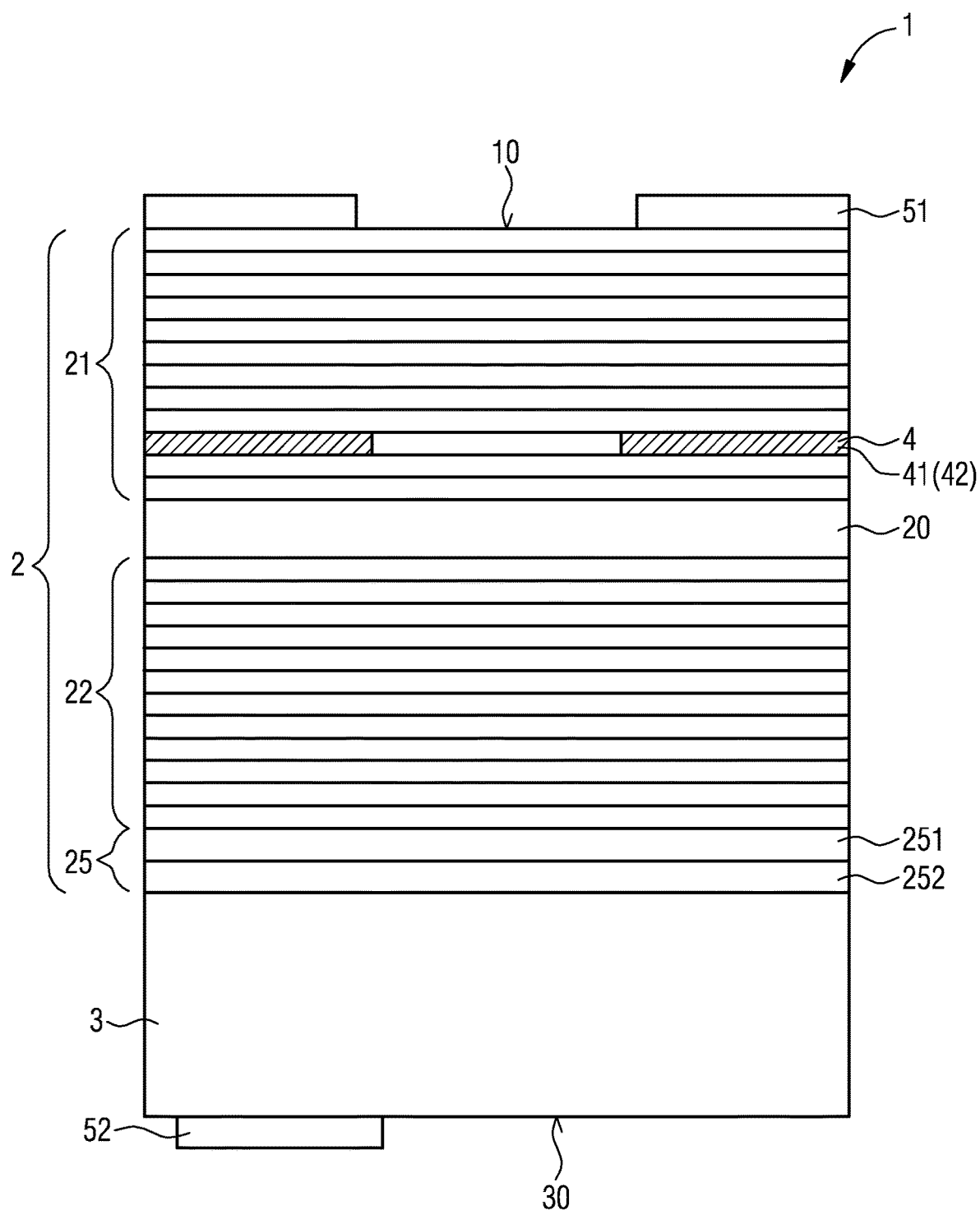

FIG. 2 shows a further exemplary embodiment of a radiation-emitting semiconductor component. This exemplary embodiment essentially corresponds to the exemplary embodiment described in connection with FIG. 1.

In contrast to the latter, the radiation-emitting semiconductor component 1 has a current constriction structure 4. The current constriction structure is configured to limit the current flow through the active region 20 in the lateral direction.

For example, the current constriction structure 4 is designed as an oxide aperture 41. Such an oxide aperture can be easily and cost-effectively formed after epitaxial deposition and lateral structuring of the semiconductor layer sequence 2. For example, a layer with a comparatively high aluminum content is suitable for the formation of an oxide aperture. For example, this layer is part of the n-conducting mirror region 21.

As an alternative to an oxide aperture, an implantation region 42 can also serve as a current constriction structure 4. Such an implantation region can be formed from the surface of the semiconductor layer sequence 2, so that a lateral structuring of the semiconductor layer sequence is not necessary for the formation of the current constriction structure 4. The position of the implantation region 42 in the vertical direction can be adjusted via the energy of the implanted protons. The implantation region may extend over one or more layers, in particular within the n-conducting mirror region 21.

Deviating from the described exemplary embodiment, the current constriction structure 4 can also be formed in a layer which is arranged outside the n-conducting mirror region 21.

Figure 3:
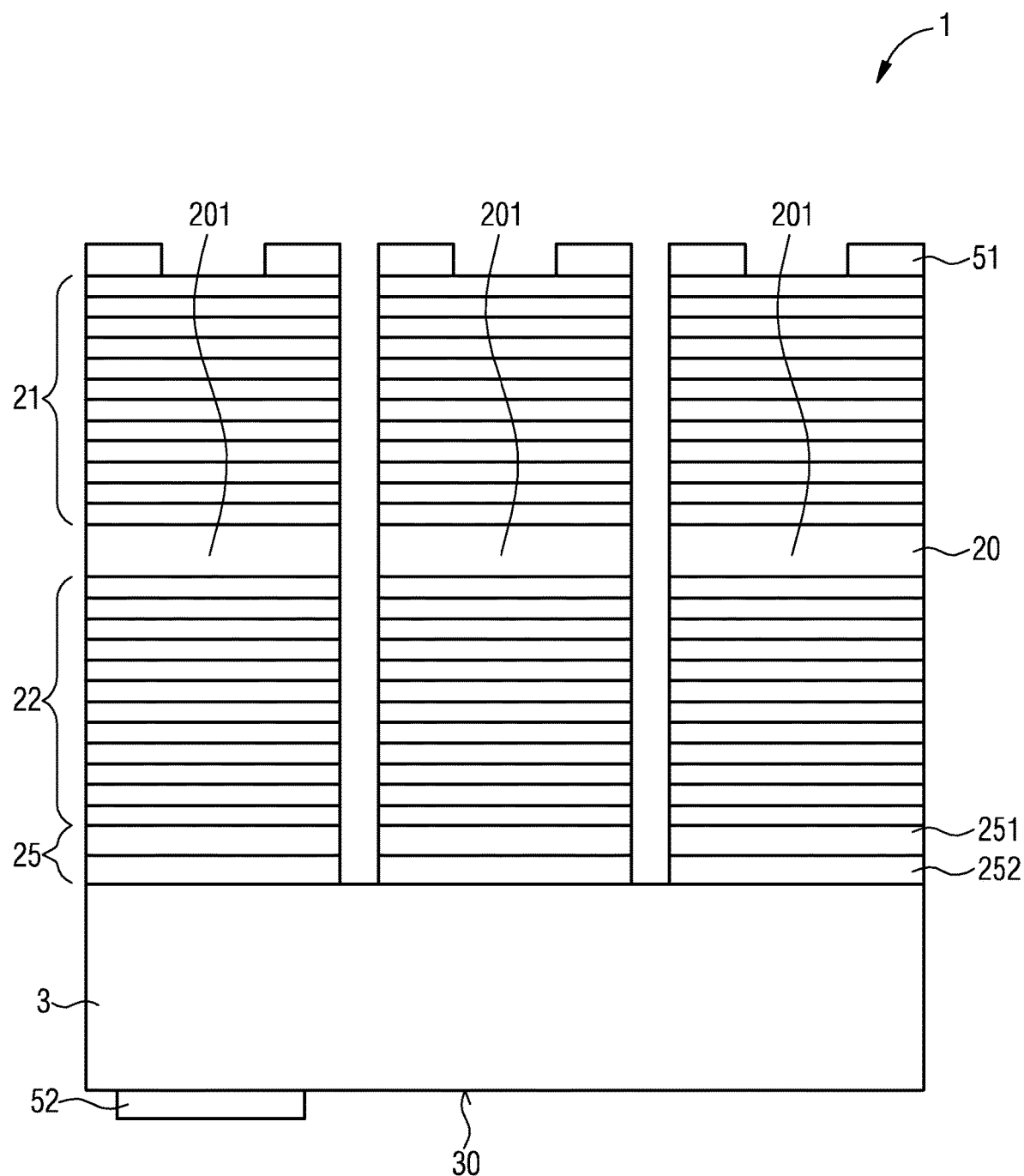

A further exemplary embodiment of a radiation-emitting semiconductor component 1 is shown in FIG. 3. This further exemplary embodiment essentially corresponds to the exemplary embodiment described in connection with FIG. 1.

In contrast to the latter, the active region 20 is divided into a plurality of segments 201. The segments 201 are arranged side by side in the lateral direction, for example, in a row or in the form of a two-dimensional matrix. A front contact 51 is assigned to each of the segments 201, so that the individual segments 201 can be operated independently of each other during operation of the radiation-emitting semiconductor component 1. The rear contact 52 can form a common rear contact for several or all segments of the radiation-emitting semiconductor component 1. Deviating from this, at least two or even all segments can also be electrically interconnected, for example in a parallel connection. In this case, the segments or at least part of the segments cannot be controlled independently of each other.

Of course, as described in connection with FIG. 2, a current constriction structure may also be present in this exemplary embodiment, in particular for each segment 201.

The electrical contacting of the segments 201 through the n-conducting mirror region 21 on the one hand and through the p-conducting mirror region 22 on the other hand allows a particularly high density for the segments 201 arranged in the lateral direction for a row-shaped and especially for a matrix-shaped arrangement of several segments in rows and columns.

The invention is not limited by the description based on the exemplary embodiments. Rather, the invention comprises any new feature as well as any combination of features, which in particular includes any combination of features in the patent claims, even if this feature or combination itself is not explicitly stated in the patent claims or the exemplary embodiments.

The invention claimed is:

1. A radiation-emitting semiconductor component comprising:
   a semiconductor layer sequence; and
   a carrier on which the semiconductor layer sequence is arranged,
   wherein the semiconductor layer sequence comprises an active region configured for generating radiation, an n-conducting mirror region and a p-conducting mirror region,
   wherein the active region is arranged between the n-conducting mirror region and the p-conducting mirror region,
   wherein the p-conducting mirror region is arranged closer to the carrier than the active region, and
   wherein the n-conducting mirror region contains at least one of Te, Sn, or Se.

2. The radiation-emitting semiconductor component according to claim 1, wherein the carrier is n-conductively doped.

3. The radiation-emitting semiconductor component according to claim 1, wherein the carrier comprises GaAs doped with silicon.

4. The radiation-emitting semiconductor component according to claim 1, wherein a tunnel junction is formed between the p-conducting mirror region and the carrier.

5. The radiation-emitting semiconductor component according to claim 4, wherein a direct electrical connection is formed between the tunnel junction and the carrier.

6. The radiation-emitting semiconductor component according to claim 1, wherein a main dopant of the n-conducting mirror region is different from silicon.

7. The radiation-emitting semiconductor component according to claim 1, wherein the semiconductor layer sequence is based on $In_yAl_xGa_{(1-x-y)}P_zAs_{(1-z)}$.

8. The radiation-emitting semiconductor component according to claim 1, wherein the radiation-emitting semiconductor component comprises a rear contact electrically conductively connected to the p-conducting mirror region via the carrier.

9. The radiation-emitting semiconductor component according to claim 1, wherein the radiation-emitting semiconductor component comprises a front contact arranged on a side of the n-conducting mirror region facing away from the active region.

10. The radiation-emitting semiconductor component according to claim 1, wherein the active region is divided into a plurality of segments.

11. The radiation-emitting semiconductor component according to claim 10, wherein the segments are independently controllable of each other.

12. The radiation-emitting semiconductor component according to claim 1, wherein the radiation-emitting semiconductor component comprises a current constriction structure.

13. The radiation-emitting semiconductor component according to claim 12, wherein the current constriction structure comprises an oxide aperture.

14. The radiation-emitting semiconductor component according to claim 12, wherein the current constriction structure comprises an implantation region.

15. The radiation-emitting semiconductor component according to claim 1, wherein the radiation-emitting semiconductor component is a VCSEL.

16. The radiation-emitting semiconductor component according to claim 1, wherein the semiconductor layer sequence comprises a radiation exit surface on a side opposite the carrier.

17. The radiation-emitting semiconductor component according to claim 16, wherein the radiation-emitting semiconductor component comprises a rear contact electrically conductively connected to the p-conducting mirror region via the carrier, and wherein the rear contact forms a common rear contact for at least two or all segments.

18. A radiation-emitting semiconductor component comprising:
a semiconductor layer sequence; and
a carrier on which the semiconductor layer sequence is arranged,
wherein the semiconductor layer sequence comprises an active region configured for generating radiation, an n-conducting mirror region and a p-conducting mirror region,
wherein the active region is arranged between the n-conducting mirror region and the p-conducting mirror region,
wherein the p-conducting mirror region is arranged closer to the carrier than the active region, and
wherein the semiconductor layer sequence is based on $In_yAl_xGa_{(1-x-y)}P_zAs_{(1-z)}$.

* * * * *